US006819053B2

(12) United States Patent
Johnson

(10) Patent No.: US 6,819,053 B2
(45) Date of Patent: Nov. 16, 2004

(54) HALL EFFECT ION SOURCE AT HIGH CURRENT DENSITY

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/419,258

(22) Filed: Apr. 21, 2003

(65) Prior Publication Data

US 2003/0184205 A1 Oct. 2, 2003

Related U.S. Application Data

(63) Continuation of application No. PCT/US01/42846, filed on Oct. 30, 2001.
(60) Provisional application No. 60/245,212, filed on Nov. 3, 2000.

(51) Int. Cl.[7] .......................... H01J 7/24; C23C 16/00; C23C 14/00
(52) U.S. Cl. ............................ 315/111.51; 315/111.41; 118/723 I; 204/298.04
(58) Field of Search ....................... 315/111.51, 111.41, 315/111.21, 111.81; 118/723 I, 723 MR, 723 VE, 723 E, 723 R; 204/298.04, 298.08, 11, 298.16, 31, 298.37, 38; 250/423 R, 423 F

(56) References Cited

U.S. PATENT DOCUMENTS

| | | | | |
|---|---|---|---|---|
| 4,277,304 | A | | 7/1981 | Horiike et al. |
| 4,541,890 | A | | 9/1985 | Cuomo et al. |
| 4,638,216 | A | | 1/1987 | Delaunay et al. |
| 4,703,222 | A | | 10/1987 | Yoshikawa et al. |
| 4,862,032 | A | * | 8/1989 | Kaufman et al. ........ 313/359.1 |
| 5,218,271 | A | | 6/1993 | Egorov et al. |
| 5,475,354 | A | | 12/1995 | Valentian et al. |
| 5,762,750 | A | * | 6/1998 | Chen et al. ............ 156/345.28 |
| 5,763,989 | A | | 6/1998 | Kaufman |
| 5,845,880 | A | | 12/1998 | Petrosov et al. |
| 6,293,090 | B1 | | 9/2001 | Olson |
| 6,392,350 | B1 | * | 5/2002 | Amano .................. 315/111.21 |
| 2002/0125223 | A1 | * | 9/2002 | Johnson et al. ........ 219/121.43 |

FOREIGN PATENT DOCUMENTS

| | | |
|---|---|---|
| EP | 0 265 365 A1 | 4/1988 |
| EP | 0 525 927 A1 | 2/1993 |

OTHER PUBLICATIONS

Kaufman et al., "End–Hall ion source," J. Vac. Sci. Technol. A 5(4), Jul./Aug. 1987, pp. 2081–2084.

Kaufman, "Theory of Ion Acceleration With Closed Electron Drift," AIAA'82, Nov. 17–19, 1982, New Orleans, pp. 1–5.

Janes et al., "Anomalous Electron Diffusion and Ion Acceleration in a Low–Density Plasma," The Physics of Fluids, vol. 9, No. 6, Jun. 1966, pp. 1115–1123.

Pinsley et al., "Hall–Current Accelerator Utilizing Surface Contact Ionization," J. Spacecraft, vol. 1, No. 5, Sep.–Oct. 1964, pp. 525–531.

Cann et al., "Hall Current Plasma Accelerator," AIAA Journal, vol. 2, No. 7, Jul. 1964, pp. 1234–1241.

* cited by examiner

*Primary Examiner*—Tuyet Thi Vo
(74) *Attorney, Agent, or Firm*—Pillsbury Winthrop LLP

(57) ABSTRACT

A high current density, low voltage ion source includes a vacuum chamber. A plasma source induces generation of a plasma within the chamber, or injects a plasma directly into the chamber. A magnetic and electric field cooperate to guide the ions from the plasma region in a beam towards a substrate to be processed by the ions. A method of use of the ion source includes production of an ion beam for processing of a substrate.

20 Claims, 2 Drawing Sheets

HALL EFFECT ION SOURCE AT HIGH CURRENT DENSITY

This application is a Continuation of International Application PCT/US01/42846, filed on Oct. 30, 2001, which, in turn, claims the benefit of U.S. Provisional Application No. 60/245,212, filed Nov. 3, 2000, the contents of both of which are incorporated herein by reference.

BACKGROUND OF THE INVENTION

The present invention relates to an apparatus for producing an ion beam of high current density and more specifically to an end-Hall ion source.

Ion beams are useful for a wide variety of applications. Surface treatment of materials by ion beam include ion implantation or coating. Processes can produce improvements in surface hardness, friction properties, wear resistance, fatigue life and oxidation resistance, among other benefits. Ion bombardment can improve adhesion in a vapor deposition process or can be used to roughen or chemically alter a surface to improve bonding of adhesive connections. Surface treatments using ion beam technologies have been applied to a wide range of materials including metals, polymers, ceramics and glasses. Many of the same results that are conventionally produced by chemical vapor deposition, ultraviolet radiation treatments or other processes may be achieved by ion beam processing of materials.

Moreover, ion beams are of considerable use in manufacture and processing of semiconductors, both for etching and for deposition. Unfortunately, conventional ion beam sources tend to produce high energy beams which can cause damage to surfaces rather than treating them. Many lower energy ion beam sources have very low current densities resulting in overly long processing times. Hall-effect ion sources have been pursued as a possible solution to these problems. For example, an end-Hall ion source such as disclosed in Kaufman et al. (U.S. Pat. No. 4,862,032) has been proposed for providing ions for processing applications. The Kaufman device, however, suffers from both of the above mentioned problems, producing an ion current of only about 1–4 $mA/cm^2$ containing ions that are accelerated to a few hundred volts, an energy level that is too high for some applications.

BRIEF SUMMARY OF THE INVENTION

To overcome the drawbacks of conventional end-Hall ion sources the present invention provides a high current density ion source which is capable of delivering ions at a low voltage including: an end-Hall effect ion source having a vacuum chamber, for producing an ion beam; and a plasma generator, arranged to produce a plasma in the vacuum chamber to supply ions to the ion source.

Another aspect of the present invention provides a high current density ion source, including a vacuum chamber, a gas injector, constructed and arranged to inject a gas which is ionizable to produce a plasma into the vacuum chamber and a target, disposed at one end of the vacuum chamber. A radio frequency electromagnetic field source is disposed outside of the vacuum chamber and constructed and arranged to provide a radio frequency electromagnetic field in a plasma generating region within the vacuum chamber, the electromagnetic field ionizing the gas to produce a plasma. A magnetic field source is disposed outside of the vacuum chamber and constructed and arranged to produce a magnetic field for guiding the plasma and a cathode is disposed within the vacuum chamber, between the plasma generating region and the target and having an opening therethrough, such that ions traveling from the plasma generating region to the target pass through the opening in the cathode.

Yet another aspect of the present invention provides a method of processing a substrate with ions which includes providing a vacuum chamber, a substrate located at an end of the vacuum chamber in a target area, a gas in the vacuum chamber which is ionizable to form a plasma, and an electromagnetic field in a plasma generating region within the vacuum chamber, thereby ionizing the gas to produce a plasma. Further, a magnetic field for guiding the plasma is provided along with a cathode within the vacuum chamber. The cathode has an opening therethrough, such that ions traveling from the plasma generating region to the target area pass through the opening in the cathode.

DETAILED DESCRIPTION OF THE INVENTION

Figure 1:
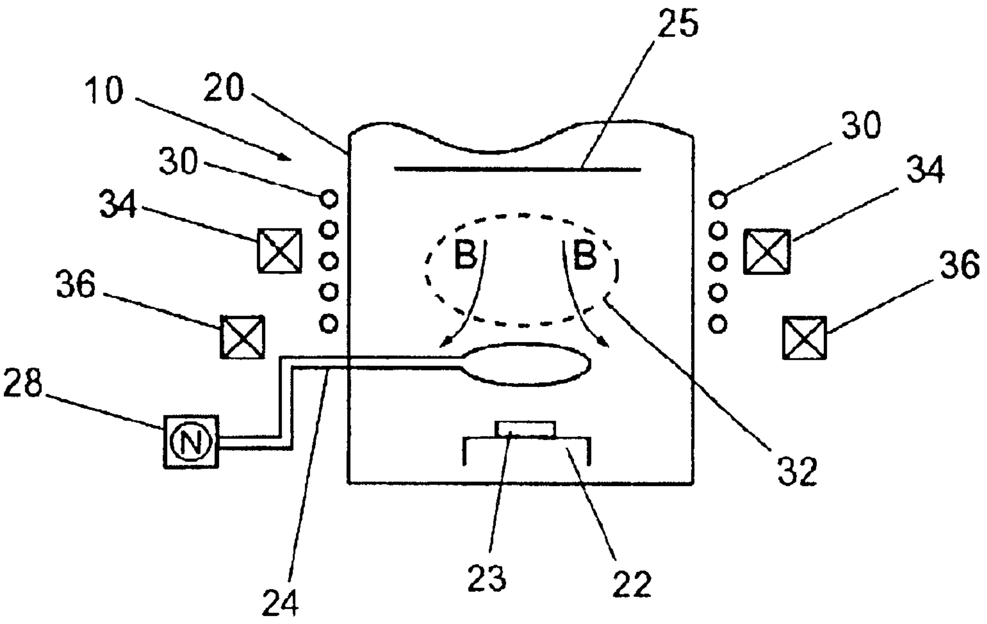
FIG. 1 is a schematic diagram of an ion source according to the present invention.
Figure 2:
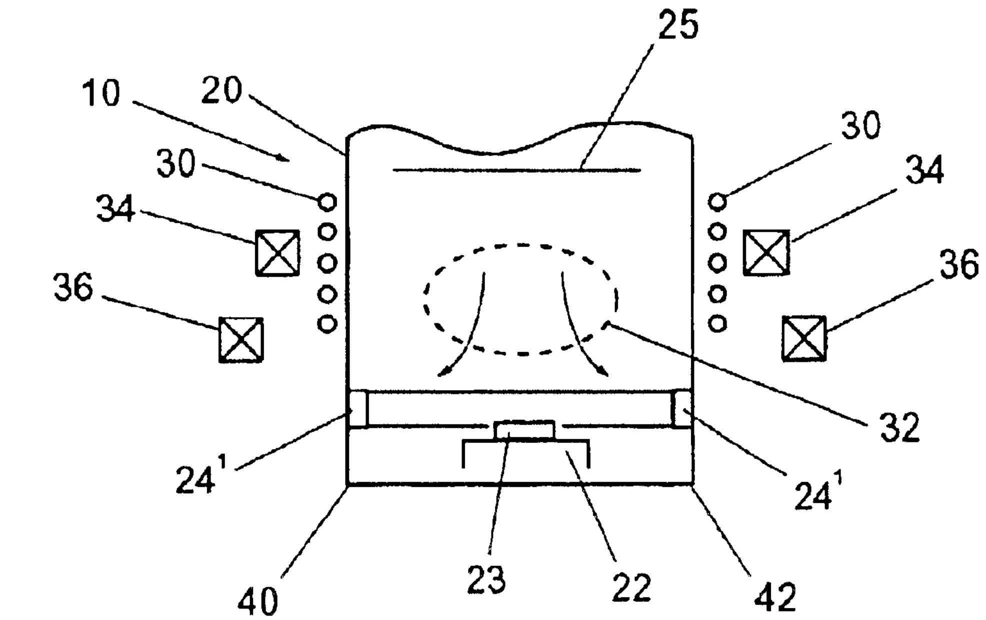
FIG. 2 is a schematic diagram of an alternate arrangement of an ion source according to the present invention.

By adding a plasma source to an end-Hall effect ion source, the resulting ion beam can have a greatly increased current density at a much lower voltage. Referring now to FIG. 1, an ion source 10 according to the present invention is shown. Within a vacuum chamber 20, a wafer chuck 22 is provided to hold a wafer 23 to be processed. Though the target is referred to here as a "wafer" for the sake of convenience, the target may actually be any substrate which is to be processed by an ion beam. For example, the target may be a sheet of a polymer material to be coated or a metal to be surface hardened by ion implantation. A cathode 24 is disposed in front of the wafer chuck 22. The cathode 24 is preferably in the form of a circular loop and is preferably made of a material such as tungsten, tantalum or another low work function cathode material. The cathode may alternately be in the form of a ring 24' which extends around the interior of the vacuum chamber 20, as shown in FIG. 2, and is insulated from the wall of the chamber 20. The cathode 24 is mounted on insulating supports (not shown) which may be made from a metal oxide such as alumina or silica (quartz) or another insulator or dielectric material. An anode 25 is disposed opposite to the cathode 24 and may take the form of a plate or grid or other appropriate anode configuration. Further, an adjustable AC power supply 28 is connected to the cathode to control the cathode's emission temperature. The cathode 24 preferably is floating at or near to the potential of the beam. Alternately, the cathode may be grounded and the anode may be connected to an AC power supply.

A gas which is ionizable to produce a plasma is injected into the vacuum chamber 20 which is preferably generally cylindrical and has an axis of radial symmetry. The gas is selected according to the desired application as understood by one skilled in the art and may preferably be nitrogen or argon, for example. An RF coil 30 surrounding the vacuum chamber 20 creates a radio frequency electric field within the vacuum chamber 20 and inductively produces a region of plasma 32 in the gas.

Two ion-extraction coils 34, 36 consisting preferably of DC electromagnets are disposed outside of the RF coil 30 and provide a magnetic field B as shown, field lines of the magnetic field extending nominally in the direction of the wafer 23 and diverging away from the wafer 23. Alternately, each electromagnetic coil may be replaced with an array of permanent magnets, arrayed to produce a similar magnetic field. For example, the array may be a ring shaped array of magnets. When permanent magnets are employed, preferably the upper ring of magnets have a polarization direction directed radially inwards, while the lower ring of magnets has a polarization direction directed radially outwards. One skilled in the art will understand how to arrange magnets to produce the desired magnetic field direction.

Preferably coil 34 has a diameter different from that of coil 36. Providing coils of differing diameters increases the ability to change configurations of the system and improves control of the magnetic field inside the vacuum chamber 20. The magnetic field B has a parallel component in the direction of the axis of symmetry and a perpendicular component in the radial direction orthogonal to the axis of symmetry. The strength of the magnetic field preferably diminishes toward the cathode. Field strength of the magnetic field in the plasma region is preferably on the order of several hundred Gauss.

An end-Hall effect ion source is disclosed in Kaufman (U.S. Pat. No. 4,862,032, hereinafter "the Kaufman patent"). The end-Hall effect ion source employed in a high current density Hall effect ion source according to the present invention generally consists of a vacuum chamber, a gas injector which injects gas into a region of the vacuum chamber, a cathode and an anode at opposite ends of the chamber, and a magnetic field source which provides a magnetic field that generally decreases in field strength in the direction from the anode to the cathode. A potential is produced between the cathode and the anode causing electrons from the cathode to be accelerated towards the anode and collide with the molecules of the gas, causing ionization. The potential difference between the cathode and anode must be large enough to impart enough energy to the electrons to cause ionization, on the order of hundreds of volts. The ions formed by the collisions are accelerated along the lines of the magnetic field and ejected from the cathode end of the chamber as an ion beam. When used for processing of a wafer 23, the wafer is placed at the cathode end of the chamber where it will be struck by the ions.

According to the Kaufman patent, ions in such a chamber are accelerated from the gas region approximately along the magnetic field lines towards the wafer 23. Though the field lines tend to curve away from the center line, the field also decreases in strength in the direction of ion travel and the ions are primarily accelerated in the direction of the axis of symmetry of the vacuum chamber 20, towards the wafer 23. This effect may alternately be understood as the plasma expanding in the direction of the magnetic field lines.

More specifically it may be stated that electrons move in the axial direction from a higher magnetic field region towards a lower magnetic field region. The migration of the electrons toward the lower magnetic field region creates an electric field in the vacuum chamber due to the increased negative charge density in the region to which electrons are migrating. This induced electric field tends to oppose the motion of additional electrons from the high magnetic field region, but also contributes to the acceleration of ions in the axial direction.

The Kaufman patent provides an equation which describes the relationship of the voltage difference between plasma potentials at two different points and a ratio of magnetic field strengths at the same two points:

$$\Delta V_P = \left(\frac{kT_e}{e}\right)\ln\left(\frac{B}{B_0}\right) \tag{1}$$

where k is Boltzmann's constant, $T_c$ is the electron temperature in Kelvin, e is the charge of an electron and B and $B_0$ are the magnetic field strengths at the two points. From this equation it can be determined that for $B>B_0$, the plasma potential V will be greater at the point where the magnetic field is B (higher field strength) and smaller where the magnetic field is $B_0$ (lower field strength). Thus, positive ions will be accelerated away from the region of high field strength and toward the relatively lower field strength region.

The DC electric field provided by the presence of the cathode 24 in combination with an anode 25 provides some additional acceleration in the direction of the wafer 23. However, the main function of this cathode 24 is to provide neutralizing electrons to the ion beam. Without neutralizing the ion beam, a positive charge would develop in the target region which would reflect incoming ions away from the target and back towards the source. As an alternative to a cathode 24, any known neutralizer may be employed to limit the buildup of charge at the target end of the chamber.

The plasma is preferably dense and cold, sources of which are known to those skilled in the art, including, for example, hollow cathode discharge sources, electron cyclotron resonance sources, multipolar high frequency sources, and inductively coupled plasma sources. In preferred embodiments of the invention, use is made of an electrostatically shielded radio frequency (ESRF) plasma source. An ESRF source provides the advantages that the plasma density and the electron temperature may be independently controlled, while many other known plasma generators do not offer this versatility.

In the case that an ESRF plasma source is used, the vacuum chamber 20 must be properly configured to allow penetration of the RF electric field. In one configuration, the chamber 20 may include a metal wall, for example aluminum, forming the perimeter of the chamber. The metal wall further has an array of slot shaped windows of dielectric material such as quartz or alumina, for example, which allow the penetration of the RF field so that the gas may be ionized. Likewise the chamber 20 may include a dielectric wall, not shown, which is in contact with the plasma. The dielectric wall preferably comprises quartz or alumina and has a grounded aluminum sheet forming an outer wall and having longitudinal slots therein.

The magnets 34, 36, which, as noted above, may be arrays of permanent magnets or electromagnetic coils, provide the axially symmetric magnetic field. Though they are shown outside the vacuum chamber 20, the magnets or electromagnetic coils may be either inside or outside of the chamber in principle. Likewise, the magnets may be inside or outside of the RF generating coil 30. If disposed within the RF coil 30, the magnets must be configured in such a way that eddy currents are limited and if disposed within the vacuum chamber, the magnets must be designed with that environment in mind.

In the case that a permanent magnet is used to generate the magnetic field B, the pole pieces must be designed and placed so as to provide an appropriate field. Likewise, an electromagnet must be properly shaped, placed and wound to produce an equivalent field. As shown by Eqn. 1, the magnetic field must be of decreasing strength in the direction of desired ion beam projection. FIG. 1 shows one method of achieving this. The upstream magnetic coil 34 is placed at a smaller radial distance from the vacuum chamber than the downstream magnetic coil 36. If the coils produce fields of similar strength, the field developed within the chamber 20 by the lower, more distant, coil 36 will be smaller than the field developed by the upper, closer, coil 34. One skilled in the art will understand that numerous other coil configurations are available to produce the general result that the field should decrease in the direction of desired ion projection.

As discussed above, a thermionic cathode 24 is disposed in the direction of the ion beam. The cathode is negatively biased relative to the anode 25. The gas injection plate or another conductor near the plasma generation region, and on a side of the plasma generation region opposite to the cathode 25, can be configured to act as the anode 25 by providing a bias thereon which is positive relative to the cathode.

The cathode 24 ejects electrons which neutralize the ion beam as the beam passes the cathode. As the cathode 24 ejects electrons, they are pulled along and mixed with the ion beam due to space charge forces. The mixed cloud of ions and electrons forms an essentially charge neutral region, eliminating the problem of the ion beam reflecting back on itself.

Alternately, the cathode 24 may be unnecessary for beam neutralization in the case where the beam has an overall neutral charge. This is possible where electrons produced in the plasma are drawn with the ions of the ion beam itself producing an electron beam traveling parallel to and juxtaposed with the ion beam.

A percentage of the ions will strike the cathode 24. Though these ions are of relatively low energy. The cathode 24 is preferably sputter resistant to prolong cathode life. For example, tungsten may be an appropriate cathode material, providing a reasonable balance of long life and relatively low cost.

Figure 3:
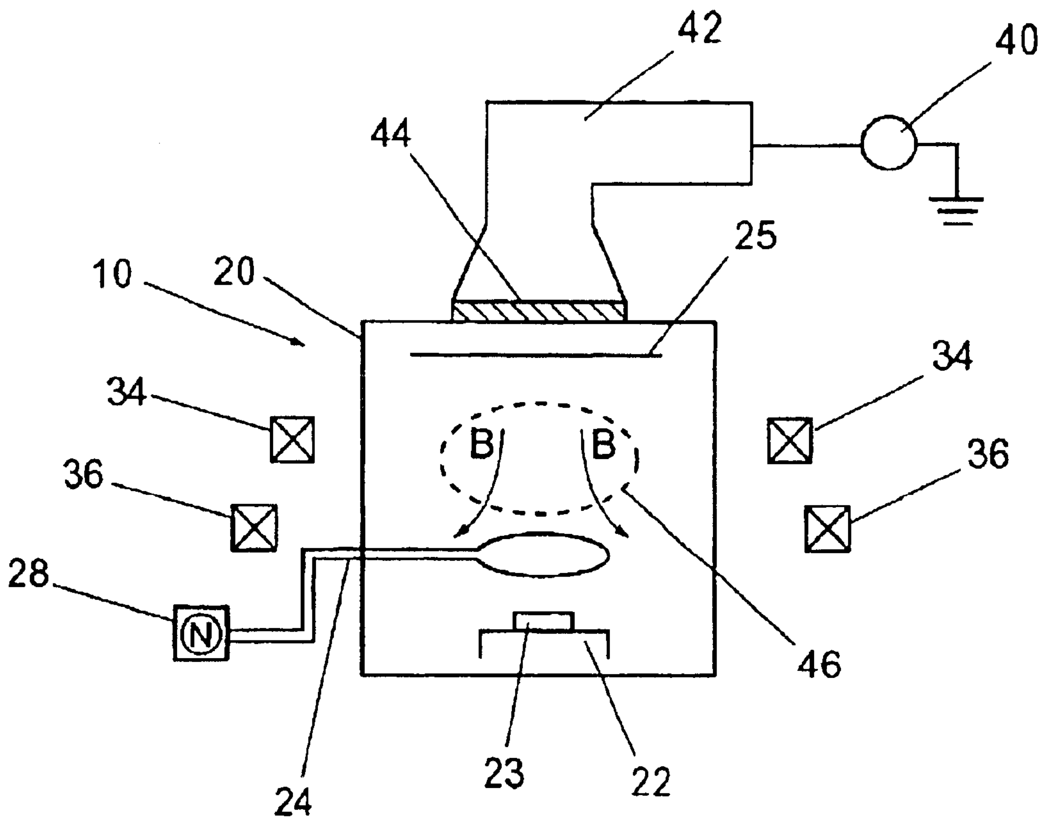
FIG. 3 is a schematic diagram of yet another arrangement of an ion source according to the present invention.

As shown in FIG. 3, an ion beam source using plasma generated by an electron cyclotron resonance source shares many components in common with the embodiments depicted in FIGS. 1 and 2. In an ECR source, however, a microwave source 40 provides a signal which is transmitted along a microwave waveguide 42. The microwaves pass through a microwave window 44 and into the vacuum chamber 20. An electron cyclotron resonance zone is indicated by the dashed line 46. As noted above, this embodiment otherwise functions in a manner similar to those using other plasma sources.

As an example of a working model of the present invention, if a tungsten loop having a diameter of 15.2 cm is used as the cathode 24, the cross-section will be approximately 181.5 $cm^2$, providing a total current of approximately 2.7 A at 14.8 $mA/cm^2$ at a cathode-anode voltage of approximately 30V. As noted above, the Kaufman device produces a current density of only about 1–4 $mA/cm^2$ and a voltage on the order of hundreds of volts. Thus, the present invention allows an increase of ion flux of more than 4 times, while allowing voltage to be decreased by a factor of about 10. This produces two advantages, first, the need for high voltage circuitry for the electrodes is eliminated, second, the ions produced may be employed in applications in which the substrate would be damaged by highly accelerated ions.

As noted above, the ion beam produced can be used for a variety of processing applications including deposition of insulator, metal or semiconductor materials onto a substrate and etching of insulator, metal or semiconductor materials.

Alternate configurations of the ion source are possible. For example, though it is noted above that the vacuum chamber is preferably cylindrical, other shapes are possible.

According to other embodiments of the invention, chuck 22 and wafer 23 may be removed and the side wall of chamber 20 may be provided, near the chamber bottom, with elongated slots 40, 42 for passage of a sheet of material to be treated. The sheet may be a long sheet which is moved past the ion beam to allow successive sheet regions to be treated. In this embodiment, slots 40 and 42 will each be provided with a sealing arrangement, such as a pair of flexible strips.

In a case in which the seal is insufficient to provide a desired pressure range of between 1 mTorr and 100 mTorr, it may be desirable to provide additional pumping capacity, by enlarging the pumping system or by providing an array of pumps.

Multiple sources for treating a single substrate can be used to provide a more uniform ion flux, particularly when the substrate has a varied surface.

While the description above refers to particular embodiments of the present invention, it will be understood that many modifications may be made without departing from the spirit thereof. The accompanying claims are intended to cover such modifications as would fall within the true scope and spirit of the present invention. For example, the embodiments are generally directed to processing of a wafer 23, however, the present invention may be employed in any appropriate application where an ion source is used. Further, though the present invention is described as a high current density beam source, it may also be employed in a lower power application, for example by reducing the diameter of the cathode.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A high current density ion source, comprising:

an end-Hall effect ion source including a vacuum chamber, for producing an ion beam;

a plasma generator, arranged to produce a plasma located in the vacuum chamber to supply ions to the ion source; and a cathode, disposed within the vacuum chamber, between the plasma generator and a target, for accelerating ions from the plasma generator toward the target.

2. A high current density ion source as in claim 1, wherein the plasma generator is an inductively coupled plasma generator.

3. A high current density ion source as in claim 1, wherein the plasma generator is an electrostatically shielded radio frequency plasma generator.

4. A high current density ion source as in claim 1, wherein the plasma generator is an electron cyclotron resonance plasma generator.

5. A high current density ion source, comprising:

a vacuum chamber having an end defining a target region;

a gas injector, constructed and arranged to inject a gas which is ionizable to produce a plasma in the vacuum chamber;

a radio frequency electromagnetic field source, constructed and arranged to provide a radio frequency electromagnetic field in a plasma generating region within the vacuum chamber, the electromagnetic field ionizing the gas to produce a plasma;

a magnetic field source, constructed and arranged to produce a magnetic field for guiding the plasma; and a cathode, disposed within the vacuum chamber, between the plasma generating region and the target region for accelerating ions from the plasma generating region toward the target region.

6. A high current density ion source as in claim 5, wherein the cathode further is adapted to emit electrons, the emitted electrons fonning a current parallel to a current formed by the ions traveling from the plasma generating region to the target, neutralizing an overall current flow to the target.

7. A high current density ion source as in claim 5, wherein the cathode has an opening therethrough for passage of ions from the plasma generating region to the target region.

8. A method of processing a substrate with ions, comprising:

providing a vacuum chamber;

providing a substrate located at an end of the vacuum chamber in a target area;

providing a gas in the vacuum chamber which is ionizable to form a plasma;

providing an electromagnetic field in a plasma generating region within the vacuum chamber, thereby ionizing the gas to produce a plasma;

providing a magnetic field for guiding the plasma;

providing a cathode within the vacuum chamber, the cathode having an opening therethrough, such that ions traveling from the plasma generating region to the target area pass through the opening in the cathode; and controlling an electric field produced by the cathode and the magnetic field to extract ions from the plasma and direct them to the target area such that they impinge on the substrate.

9. A method as in claim 8, wherein the ions traveling from the plasma generating region to the target area comprise an ion beam, the method further comprising:

producing a plurality of ion beams which each are directed at respective areas of the substrate to process the substrate.

10. A method as in claim 8, wherein the providing of an electromagnetic field is performed by producing an inductively coupled electromagnetic field.

11. A method as in claim 10, wherein the inductively coupled electromagnetic field is produced by an electrostatically shielded radio frequency source.

12. A method as in claim 8, wherein the electromagnetic field is an electron cyclotron resonance field.

13. The high current density ion source of claim 1, wherein the current density is greater than 4 $mA/cm^2$.

14. The high current density ion source of claim 13, wherein the current density is about 14.8 $mA/cm^2$.

15. The high current density ion source of claim 1, having a cathode-anode voltage of less than 100V.

16. The high current density ion source of claim 15, wherein the cathode-anode voltage is about 30V.

17. The high current density ion source of claim 13, having a cathode-anode voltage of less than about 100V.

18. The high current density ion source of claim 17, wherein the cathode-anode voltage is about 30V.

19. The high current density ion source of claim 14, having a cathode-anode voltage of less than 100V.

20. The high current density ion source of claim 19, wherein the cathode-anode voltage is about 30V.

* * * * *